United States Patent
Lin et al.

(10) Patent No.: US 7,349,243 B2
(45) Date of Patent: Mar. 25, 2008

(54) 3-PARAMETER SWITCHING TECHNIQUE FOR USE IN MRAM MEMORY ARRAYS

(75) Inventors: Wen-Chin Lin, Hsinchu (TW); Denny Tang, Hsinchu (TW); Hsu-Chen Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 194 days.

(21) Appl. No.: 11/379,527

(22) Filed: Apr. 20, 2006

(65) Prior Publication Data

US 2007/0247900 A1    Oct. 25, 2007

(51) Int. Cl.
*G11C 11/00*    (2006.01)
(52) U.S. Cl. .................. 365/158; 365/171; 365/173
(58) Field of Classification Search ................ 365/158, 365/171, 173
See application file for complete search history.

(56) References Cited

U.S. PATENT DOCUMENTS

| | | |
|---|---|---|
| 5,640,343 A | 6/1997 | Gallagher et al. |
| 6,385,082 B1 | 5/2002 | Abraham et al. |
| 6,522,579 B2 | 2/2003 | Hoenigschmid |
| 6,545,906 B1 | 4/2003 | Savtchenko, et al. |
| 6,744,651 B2 | 6/2004 | Tang |
| 6,819,568 B2 | 11/2004 | Cao |
| 6,865,105 B1 | 3/2005 | Tran |
| 6,985,383 B2 * | 1/2006 | Tang et al. .................. 365/171 |
| 7,154,798 B2 * | 12/2006 | Lin et al. ..................... 365/209 |
| 2005/0073882 A1 | 4/2005 | Smith et al. |

* cited by examiner

*Primary Examiner*—Pho M. Luu
(74) *Attorney, Agent, or Firm*—Baker & McKenzie LLP

(57) ABSTRACT

Disclosed herein are various embodiments of a 3-parameter switching technique for MRAM memory cells arranged on an MRAM array. The disclosed technique alters the relationship between the disturbance margin and write margin of MRAM arrays to reduce the overall disturbance for the arrays by either enlarging the write margin with respect to the original disturbance margin or enlarging the disturbance margin in view of the original write margin. In either approach, the disclosed 3-parameter switching technique successfully decreases the inadvertent writing of unselected bits.

20 Claims, 10 Drawing Sheets

3-PARAMETER SWITCHING TECHNIQUE FOR USE IN MRAM MEMORY ARRAYS

TECHNICAL FIELD

Disclosed embodiments herein relate generally to magnetic random access memory (MRAM) devices, and more particularly to MRAM devices arranged in an array having a three-parameter write operation, wherein one of the three-parameters comprises a non-magnetic affect on select ones of the MRAM devices to be written.

BACKGROUND

The principle governing the operation of the memory cells in magnetic random access memory (MRAM) cells or bits is the change of resistivity of certain materials in the presence of a magnetic field (magneto-resistance). Magneto-resistance can be significantly increased by means of a structure known as a spin valve. The resulting increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are a low coercivity (free) ferromagnetic layer, a non-magnetic spacer layer, and a high coercivity ferromagnetic layer. The latter is usually formed out of a soft ferromagnetic layer that is pinned magnetically by an associated antiferromagnetic layer. When the free layer is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, coupling field and demagnetization field. If the magnetization direction of the pinned layer is parallel to the free layer, electrons passing between the free and pinned layers, suffer less scattering. Thus, the resistance at this state is lower, when current flows along the film plane. If, however, the magnetization of the pinned layer is anti-parallel to the free layer, electrons passing from one layer into the other will suffer more scattering so the resistance of the structure will increase. The change in resistance of spin valve is typically 8-15%.

This simple sandwich structure of ferromagnetic layer-thin conductor-ferromagnetic layer can be used as a memory element. In this structure, there is no anti-ferromagnetic layer, thus, neither of the two ferromagnetic layers is pinned. This kind of memory cell is called a pseudo-spin valve memory cell. Both are free to switch magnetization under external field. One of the ferromagnetic layers is thicker than the other, the thicker one switches magnetization direction at a higher external magnetic field.

However, of special interest for the present disclosure is the magnetic tunneling junction (MTJ) in which the layer that separates the free and pinned layers is a non-magnetic insulator, such as alumina or silica. Its thickness needs to be such that it will transmit a significant tunneling current. The principle governing the operation of the MTJ cell in MRAM arrays is the change of resistivity of the tunnel junction between two ferromagnetic layers. When the magnetization of the two ferromagnetic layers is in opposite directions, the tunneling resistance increases due to a reduction in the tunneling probability. The change of resistance is typically 40% for alumina tunnel junction and 200% for MgO, which is much larger than for GMR devices.

A typical magnetic tunnel junction device is made up of three basic layers. A top ferromagnetic (FM) layer, a tunnel oxide insulating layer and a bottom FM layer. The magnetization of the top FM layer is free to switch states while the bottom electrical conducting FM layer is pinned, usually by an antiferromagnetic (AF) material, such as PtMn or NiMn. Those layers that are below the tunnel junction are typically referred to as base layers. Depending on the order in which layers are deposited, the base layer could be a ferromagnetic layer on an antiferromagnetic layer on a seed layer or it could be a single ferromagnetic layer. Typically, the base layer is electrically conductive and the thickness of the base layer is less than 500 Å.

The cell states are programmed by applying an external magnetic field to switch the magnetization of the free layer. A current in the program line under a cell generates the program field. Conductive traces referred to as word lines and bit lines are routed across the array of memory cells. The word lines extend along rows of the memory cells and the bit lines extend along columns of the memory cells. A memory cell stores a bit of information as an orientation of magnetization in the sense layer at each intersection of a word line and a bit line. The orientation of magnetization in the sense layer aligns along an axis of the sense layer referred to as its "easy axis". The orientation of magnetization does not easily align along an axis orthogonal to the easy axis, referred to as the "hard axis". Magnetic fields are applied to flip the orientation of magnetization in the sense layer along its easy axis to either a parallel or anti-parallel orientation with respect to the orientation of magnetization in the reference layer. The resistance through the memory cell differs according to the parallel or anti-parallel orientation of magnetization and is highest when the orientation is anti-parallel, i.e. one logic state, and lowest when the orientation is parallel, i.e. the other logic state.

A problem associated with the programming of MRAM devices has been that the required current is orders of magnitude larger than that needed for many other memory devices, such as static random access memory (SRAM) or dynamic random access memory (DRAM), being in the range of 6-10 mA. Furthermore, cell size does not scale with lithography. For such large program currents, the width of the program lines of the cell is much greater than the minimal wire widths allowed by the design rules. In addition, today's metal-oxide-semiconductor field effect transistors (MOSFETs) can only provide 0.2-0.5 mA for a gate width of 1 μm, so to switch a 10 mA current, a MOSFET must be designed with a gate width greater than 20 μm—which is too large for effective use of substrate real estate. Thus, it is very important to minimize the program current in MRAM arrays.

SUMMARY

Disclosed herein are various embodiments of a 3-parameter switching technique for MRAM memory cells arranged on an MRAM array. The disclosed technique alters the relationship between the disturbance margin and write margin of MRAM arrays to reduce the overall disturbance for the arrays by either enlarging the write margin with respect to the original disturbance margin or enlarging the disturbance margin in view of the original write margin. In either approach, the disclosed 3-parameter switching technique successfully decreases the inadvertent writing of unselected bits.

In one aspect, a method of writing data to an array of magnetic memory cells using three parameters is disclosed. In one embodiment, the method includes providing a non-magnetic effect, such as a heat effect, to select ones of the memory cells sufficient to decrease a coercivity of the select memory cells below a predetermined threshold. The method further includes providing a first magnetic field proximate to the select ones of the memory cells, and providing a second magnetic field proximate to the select ones of the memory cells during the providing of the first magnetic field. In such embodiments, the method further includes altering the magnetic moment of the select memory cells by exceeding a threshold magnetic field of the select memory cells with a combination of the decreased coercivity, the first magnetic field, and the second magnetic field.

In another aspect, an array of magnetic memory cells is disclosed, where each of the memory cells comprising a stack of a free ferromagnetic layer, a pinned ferromagnetic layer, and an insulating tunneling barrier located therebetween. In one embodiment, the array comprises first conductive lines corresponding to each of the plurality of memory cells for providing a current to select ones of the memory cells during a write operation sufficient to decrease a coercivity of the select memory cells below a predetermined threshold. In addition, the array includes second conductive lines proximate to corresponding first groups of the memory cells for providing a first magnetic field to the select ones of the memory cells during the write operation. In such embodiments, the array also includes third conductive lines proximate to corresponding second groups of the memory cells for providing a second magnetic field to the select ones of the memory cells during the write operation. With this construction, a combination of the decreased coercivity, the first magnetic field, and the second magnetic field exceed a threshold magnetic field of the select memory cells to alter the magnetic moment of those memory cells during the write operation.

BRIEF DESCRIPTION OF THE DRAWINGS

For a more complete understanding of the principles disclosed herein, and the advantages thereof, embodiments are illustrated by way of example in the following figures in which like reference numbers indicate similar parts, and in which.

DETAILED DESCRIPTION

The nonvolatile storage capabilities of the MRAM cells have fueled the design of very large MRAM arrays for holding large amounts of data in a device with no moving parts. However, from the point of view of data retention, MRAM cells must maintain a finite switching threshold such that there is little or no probability of an accidental cell switch by the thermal energy imposed on the cells in newer array designs. Generally, the probability of accidentally switching is proportional to:

$$\mathrm{Exp}(-E/kT),$$

where E is the barrier energy between the two states, and:

$$E = Hc * V,$$

Hc being the coercivity and V the physical volume of the free layer material of the cell. The barrier is a function of cell material and cell geometry. Typically, an MRAM cell should be designed to satisfy:

$$E \leq 40kT,$$

where k is Boltzmann's constant and T is the absolute temperature of the cell. Hence MRAM cells should not be designed with arbitrarily small switch fields.

Figure 1A:
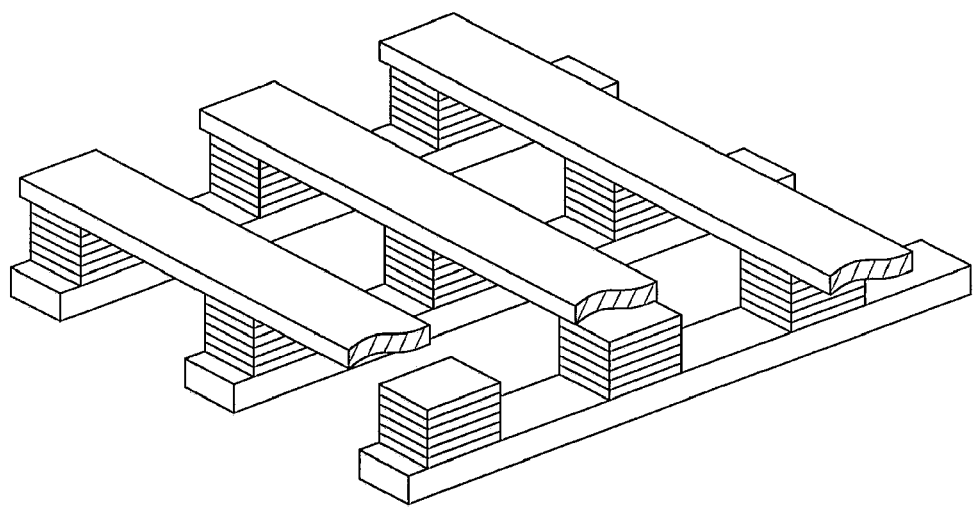
FIG. 1A illustrates one embodiment of a conventional MRAM array employing a 2-parameter switching method.
Figure 1B:
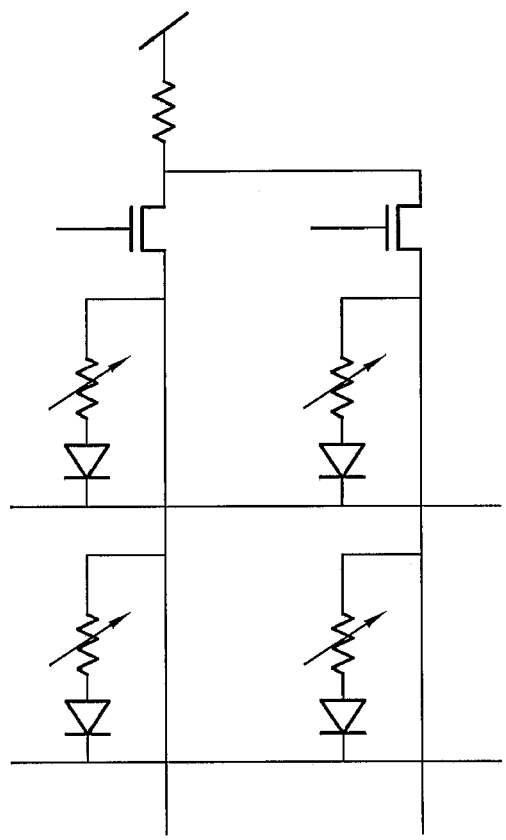
FIG. 1B illustrates a circuit diagram for the conventional array illustrated in FIG. 1A.

Most conventional MRAM designs, for example, an array found in U.S. Pat. No. 5,640,343 and illustrated in FIG. 1A, implement two magnetic fields, one along the easy axis and the other along the hard axis, to switch a selected MRAM bit. This is referred to as a 2-parameter switching method, since only the two lines need to be activated to write data to an MRAM cell. FIG. 1B illustrates a circuit diagram for the conventional array illustrated in FIG. 1A. In such designs, a write circuit is electrically coupled to the word lines and the bit lines to write the state of an MRAM cell. The write circuit selects one word line and one bit line to change the orientation of magnetization in the sense layer of the memory cell situated at the conductors crossing point. A write current is passed through a word line to create a magnetic field along the hard axis and another write current is passed through a bit line to create a magnetic field along the easy axis. The hard axis magnetic field loosens the sense layer orientation of magnetization and the easy axis magnetic field flips the sense layer orientation of magnetization along the easy axis to switch the state of the memory cell.

Figure 2B:
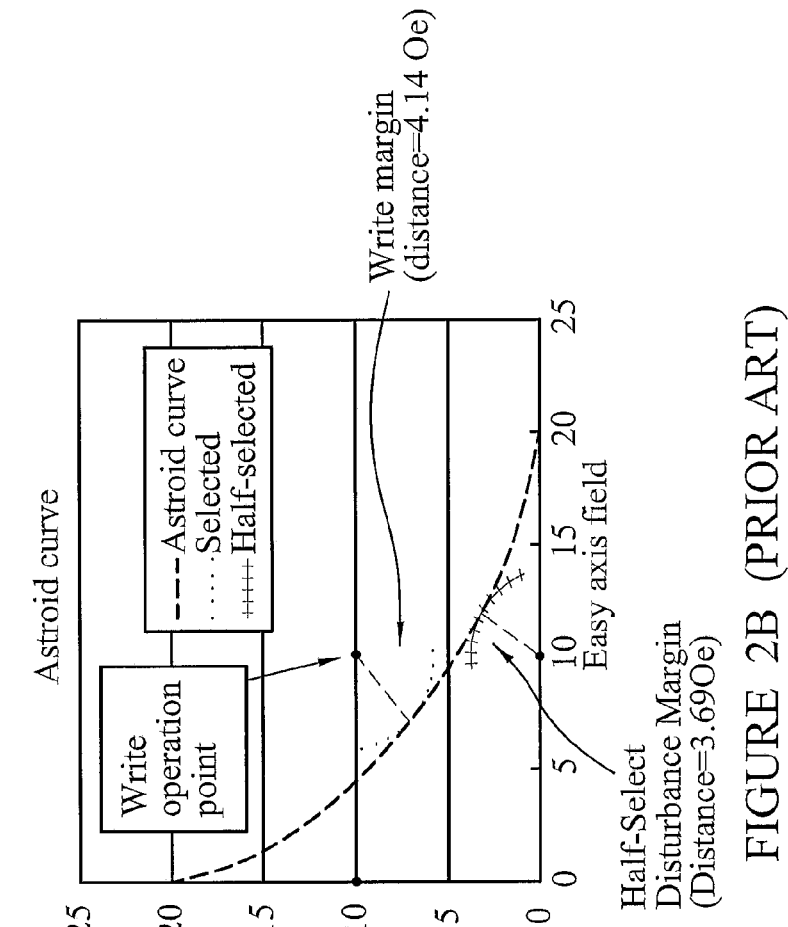
FIG. 2B illustrates a close up of the First Quadrant of the astroid curve illustrated in FIG. 2A.
Figure 2A:
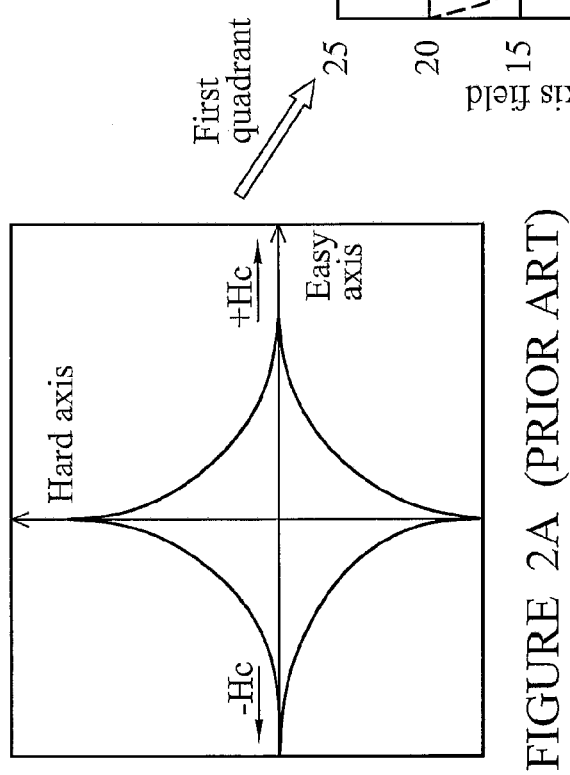
FIG. 2A illustrates an astroid curve defining both a write margin and half-selected margin of a conventional free layer.

The magnitudes of the magnetic fields in the selected memory cell surpass levels needed to set or switch the state of the memory cell. The margin by which the magnitudes surpass the levels needed is referred to as a "write margin." A large write margin ensures that the selected memory cell is written. However, an easy axis magnetic field alone can change the state of other memory cells also associated with the activated bit line. The non-selected memory cells along the selected word line and bit line are presented with only one magnetic field. These memory cells are referred to as "half-selected" memory cells. The margin between the magnitude of the magnetic field in the half-selected memory cell and the level needed to switch the half-selected memory cell is referred to as the "half-select margin." A large half-select margin ensures that half-selected memory cells will not be inadvertently switched. The astroid curve illustrated in FIG. 2A, along with the close up of the First Quadrant of the astroid curve that is illustrated in FIG. 2B, defines both a write margin and half-select ("disturbance") margin of a free layer, and consequently the operational window for MRAM cells employing the free layer.

The magnitudes of the magnetic fields needed to switch the state of a memory cell vary from cell to cell across the array. Some selected memory cells will not switch if the write currents and subsequent magnetic fields are too small. Alternatively, some half-selected memory cells will switch if the easy axis magnetic field surpasses a certain magnitude. Intermittent and inadvertent switching problems call for extra error correction mechanisms or the array is gradually rendered unreadable. Increasing the write margin and half-select margin reduces these problems and makes for a more reliable magnetic memory.

Figure 3A:
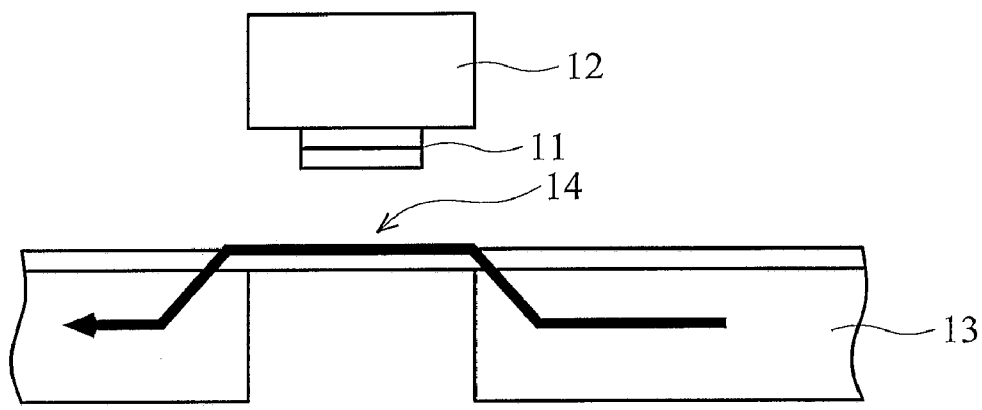
FIG. 3A illustrates as side view of an exemplary embodiment of an MRAM array employing a thermally-assisted switching technique.
Figure 3B:
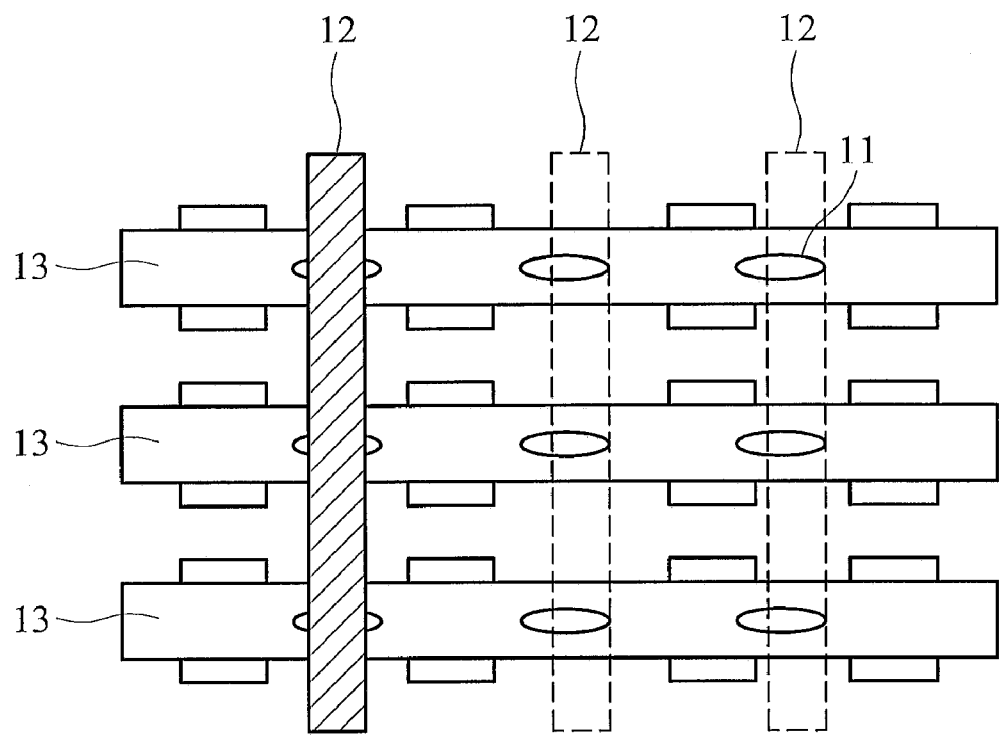
FIG. 3B illustrates a plan view of the MRAM array illustrated in FIG. 3A.

In addition, this problem becomes more prevalent when more and more MRAM bits are squeezed into an array. The write operation point is the result of a trade-off between the write and half-selected margins. Obviously, both margins shrink as the bit-to-bit deviation increases along with the memory size. Conventional attempts to address this problem have included the development of new free layer materials to achieve larger operation margin through an astroid curve with lesser deviations. In other conventional approaches, thermal-assisted switching techniques were disclosed. FIGS. 3A and 3B illustrate an exemplary embodiment of such thermally-assisted switching from U.S. Pat. No. 6,744,651. In such approaches, conductive lines are employed, either in contact or only proximate to, MRAM cells to heat selected cells during a write operation. By heating the selected cells, a smaller current may employed in the write operation, thus decreasing power consumption of the MRAM array and allowing smaller circuit components (e.g., MOSFETs) to be employed that can operate using such reduced currents.

However, this prior approach still employed a 2-parameter switching technique, namely, a first line for a current flow to impose thermal energy on the cell and a second line to generating one magnetic field proximate to the heating cell(s) to switch its state. In contrast, the disclosed technique addresses both the write and disturbance margins in order to further reduce the probability that partially-selected cells are inadvertently switched during a write operation. Specifically, the selectivity of the specific cells to be written would be enhanced if more than 2 parameters, for example, 3 parameters, are used to select and switch an MRAM cell. The result is fewer overall disturbances in partially-selected cells since, for example, a ⅓-selected cell is less likely to be inadvertently switched than ½-selected cell because a larger number of "parameters" (i.e., activated lines associated with cells on the array) are activated during a normal writing operation. Therefore, the same disturbance margin may be kept while write stability across the array is increase, as well as the flip-side of keeping the write stability the same while the disturbance margin is increased such that the likelihood of partially-selected cells being switched is decreased.

Figure 4A:
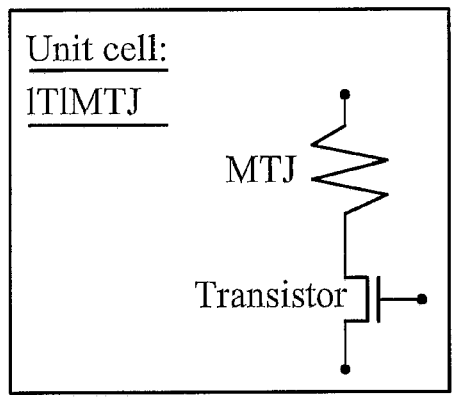
FIG. 4A illustrates a first embodiment of an MRAM array employing the disclosed principles.
Figure 4A:
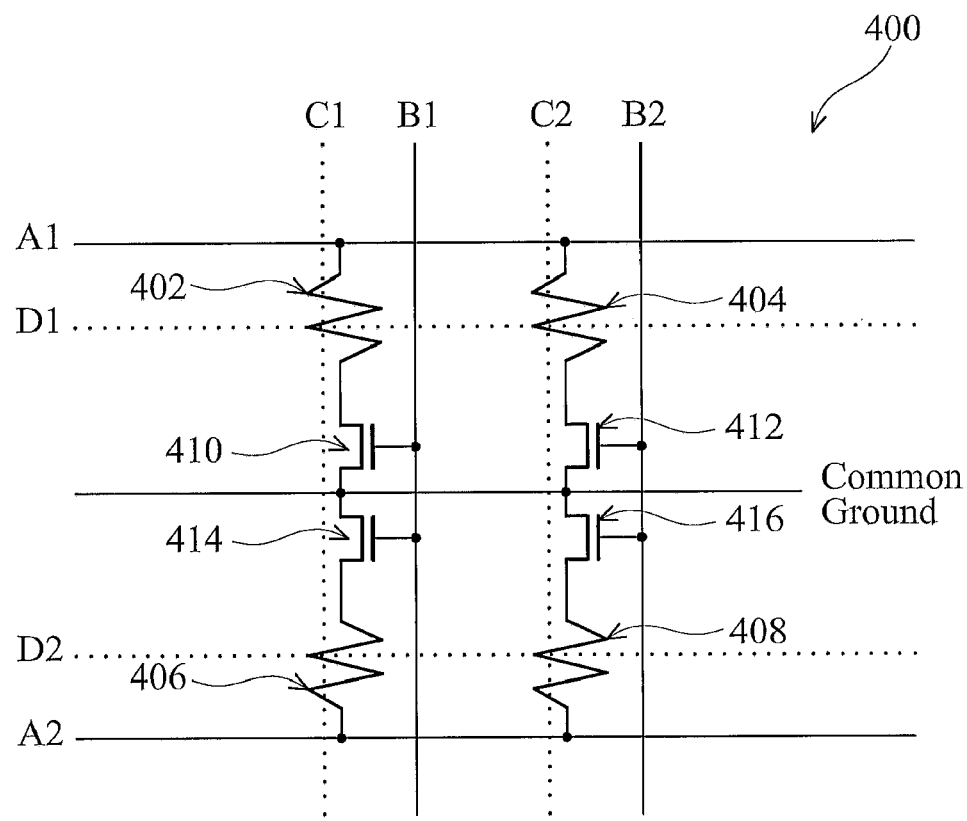

A first embodiment of an MRAM array 400 employing the disclosed principles is a circuit and switching method shown in FIG. 4A. The exemplary array 400 includes four MTJ cells or bits 402, 404, 406, 408, and four switching devices 410, 412, 414, 416, which in this example are MOSFETs, coupled to corresponding ones of these MTJ bits. Both the dashed lines C and D depict the metal line carrying a current to generate the appropriate magnetic field used for switching cells. For example, bit 402 is in the intersection of C1 and D1, in which C1 and D1 may not connect to the MTJ electrically, but magnetically. A current flows through MTJ of bit 402 and heats it simultaneously when A1 is ON and B1 is selected. The coercive field (Hc) of the free layer of the MTJ is lowered because of the increasing temperature, which constitutes the first parameter in the disclosed 3-parameter switching technique. Meanwhile, C1 and D1 are turned ON to contribute magnetic fields and program/write to bit 402, which are the remaining two parameters in the 3-parameter technique. Since Hc has been lowered, less current in either C1 or D1 is required, and consequently disturbance is fewer/less (as may be seen in astroid curves in FIGS. 7 and 8, which are discussed below).

Figure 4B:
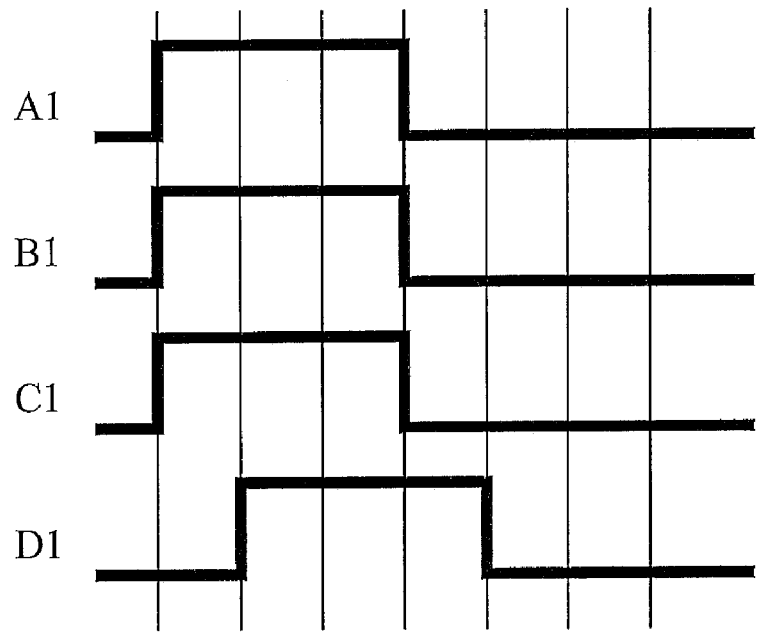
FIG. 4B illustrates a timing diagram showing the details of operating using the disclosed technique for the embodiment of FIG. 4A.

FIG. 4B illustrates a timing diagram 450 showing the details of operating using the disclosed technique for the embodiment of FIG. 4A. In the timing diagram, the A1 and B1 pulses may or may not synchronize, but they are at least partly overlapped. Similarly, C1 and D1 pulses may or may not synchronize, but they are at least partly overlapped as the latent heat (controlled by A1 and B1 ) is still effectively keeping Hc lower. In addition, the magnetic field generated from C1 and D1 may align with the easy axis and the hard axis of the free layer of the MTJ, respectively. It also could be feasible to align both the magnetic fields in the directions other than easy/hard axis when "toggle-mode" switching (U.S. Pat. No. 6,545,906) is used.

Figure 5A:
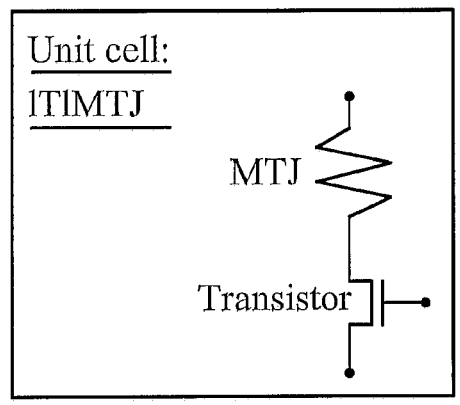
FIG. 5A illustrates a second embodiment of an MRAM array employing the disclosed principles.
Figure 5A:
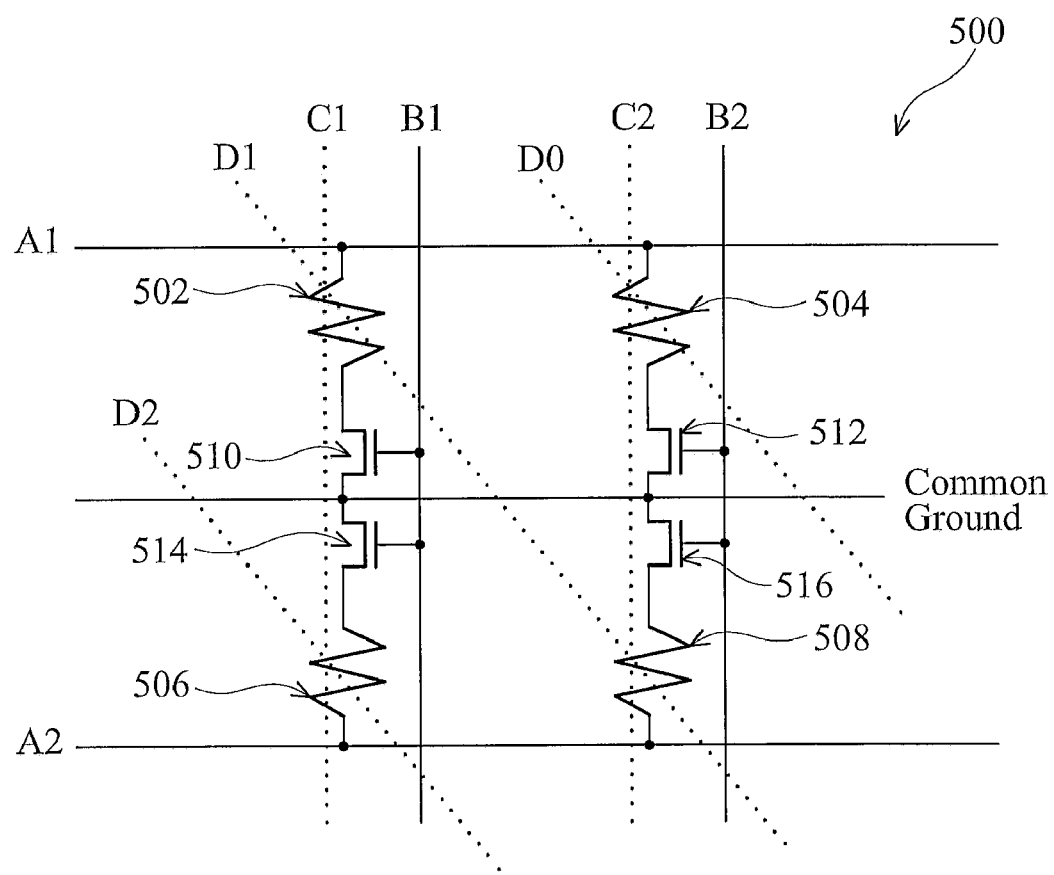
Figure 5B:
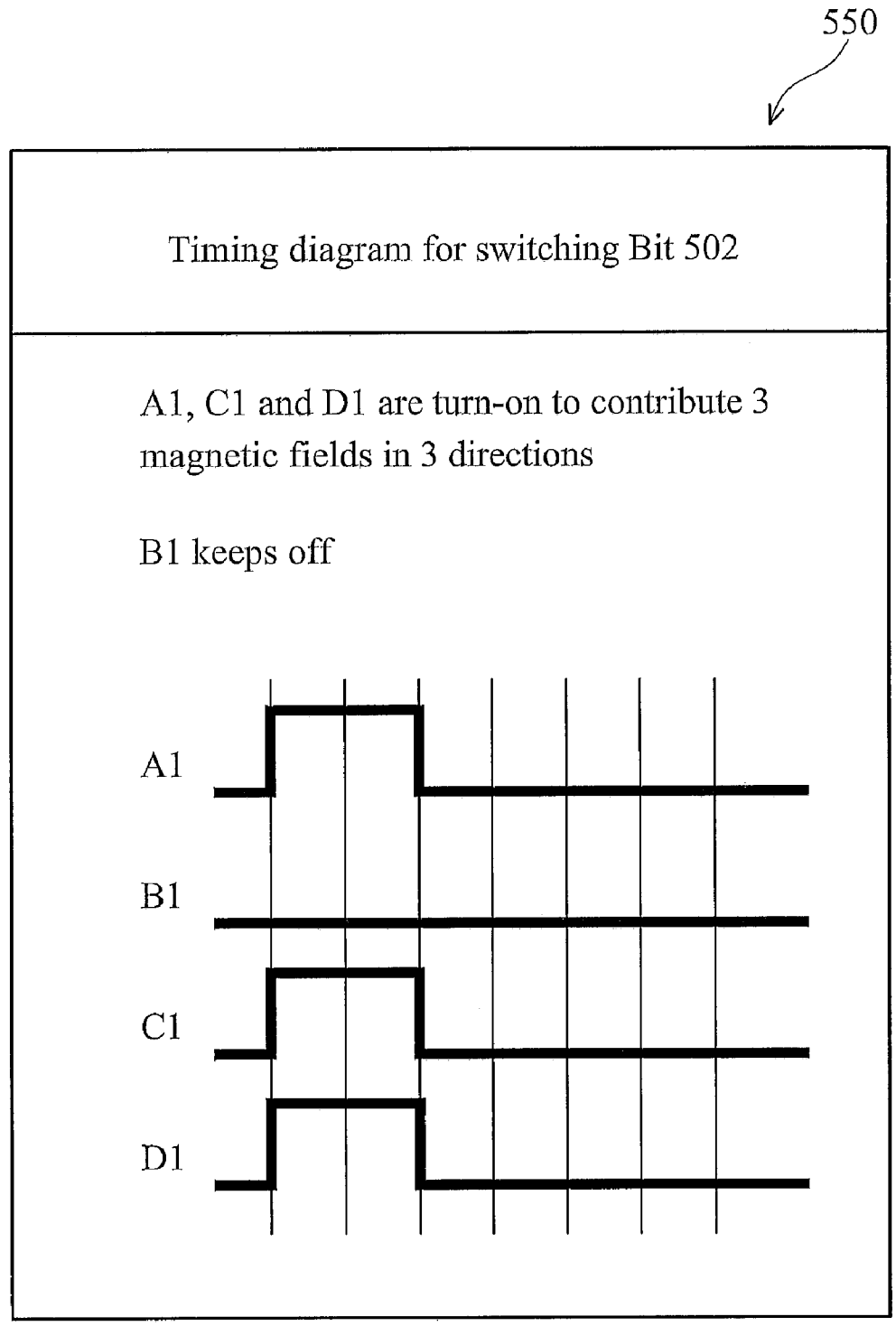
FIG. 5B illustrates a timing diagram showing the details of operating using the disclosed technique for the embodiment of FIG. 5A.

A second embodiment of an MRAM array 500 employing the disclosed principles is a circuit and switching method shown in FIG. 5A. This exemplary array 500 also includes four MTJ cells or bits 502, 504, 506, 508, and four switching devices 510, 512, 514, 516, which in this example are again MOSFETs, coupled to corresponding ones of these MTJ bits. Three magnetic fields in three directions are implemented to switch a selected MRAM bit, e.g., bit 502. In this embodiment, there are no more half-selected bits; instead they are ⅓-selected bit, thus employing 3-parameter switching. The ⅓-selected bits face fewer disturbances than bits found in the prior art that are cataloged as 2-parameter switching. As a result, the enlarged operation margin makes large-capacity MRAM arrays more affordable to manufacture and more efficient to operate due to decreased operation currents.

Figure 6A:
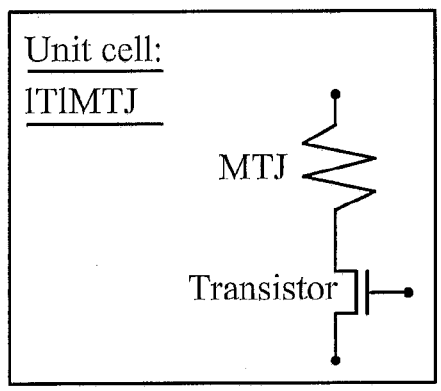
FIG. 6A illustrates a third embodiment of an MRAM array employing the disclosed principles.
Figure 6A:
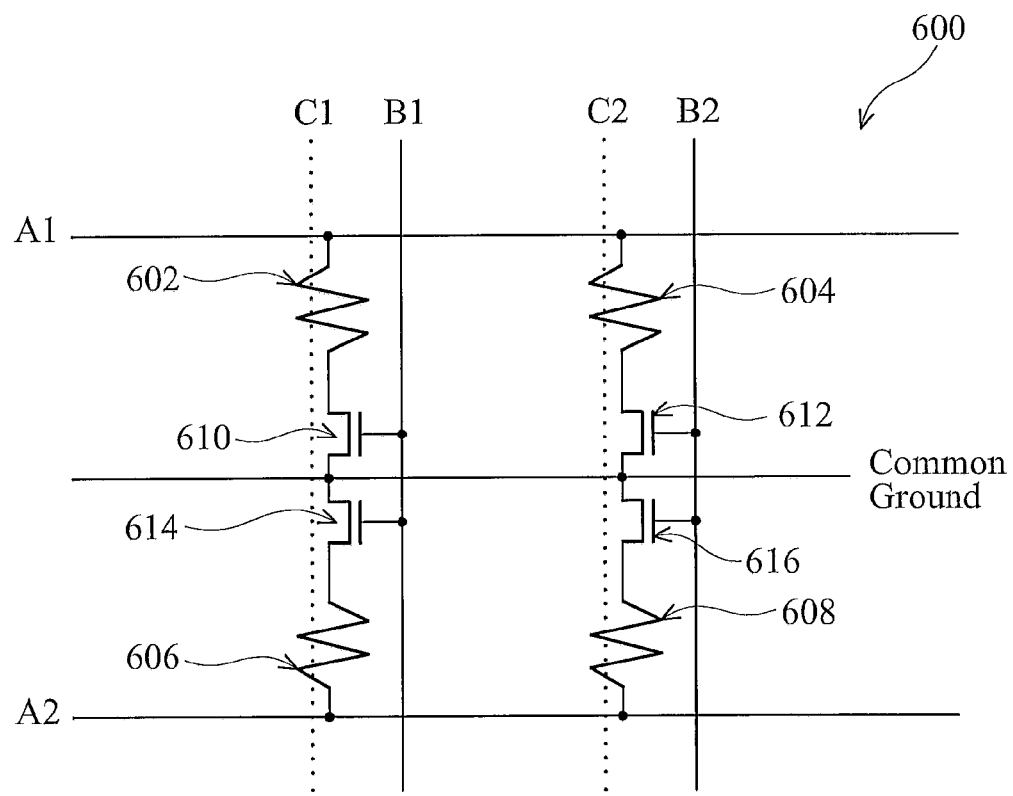

A third embodiment of an MRAM array 600 employing the disclosed principles is a circuit and switching method is shown in FIG. 6A. The exemplary array 600 again also includes four MTJ cells or bits 602, 604, 606, 608, and four switching devices 610, 612, 614, 616, which are again MOSFETs, coupled to corresponding ones of these MTJ bits. Generally, metal line A1 is used to conduct heating current (Level 1) through the MTJ of bit 602 when switch 610 is selected using line B1, and then conduct switching current to generate a magnetic field when B1 is deselected (i.e., stopping current flow through switch 610). The magnetic fields generated from both A1's Level 2 and C1 are applied so quickly that the latent heat dissipates but does not totally vanish. This means the Hc of the free layer is still lower than before heating. Since the Hc has been lowered, as in the case in the embodiment discussed with reference to FIGS. 4A and 4B, less current in either A1 (Level 2) or C1 is required, and consequently disturbance is less. (Again refer to the astroid curves in FIGS. 7 and 8).

Figure 6B:
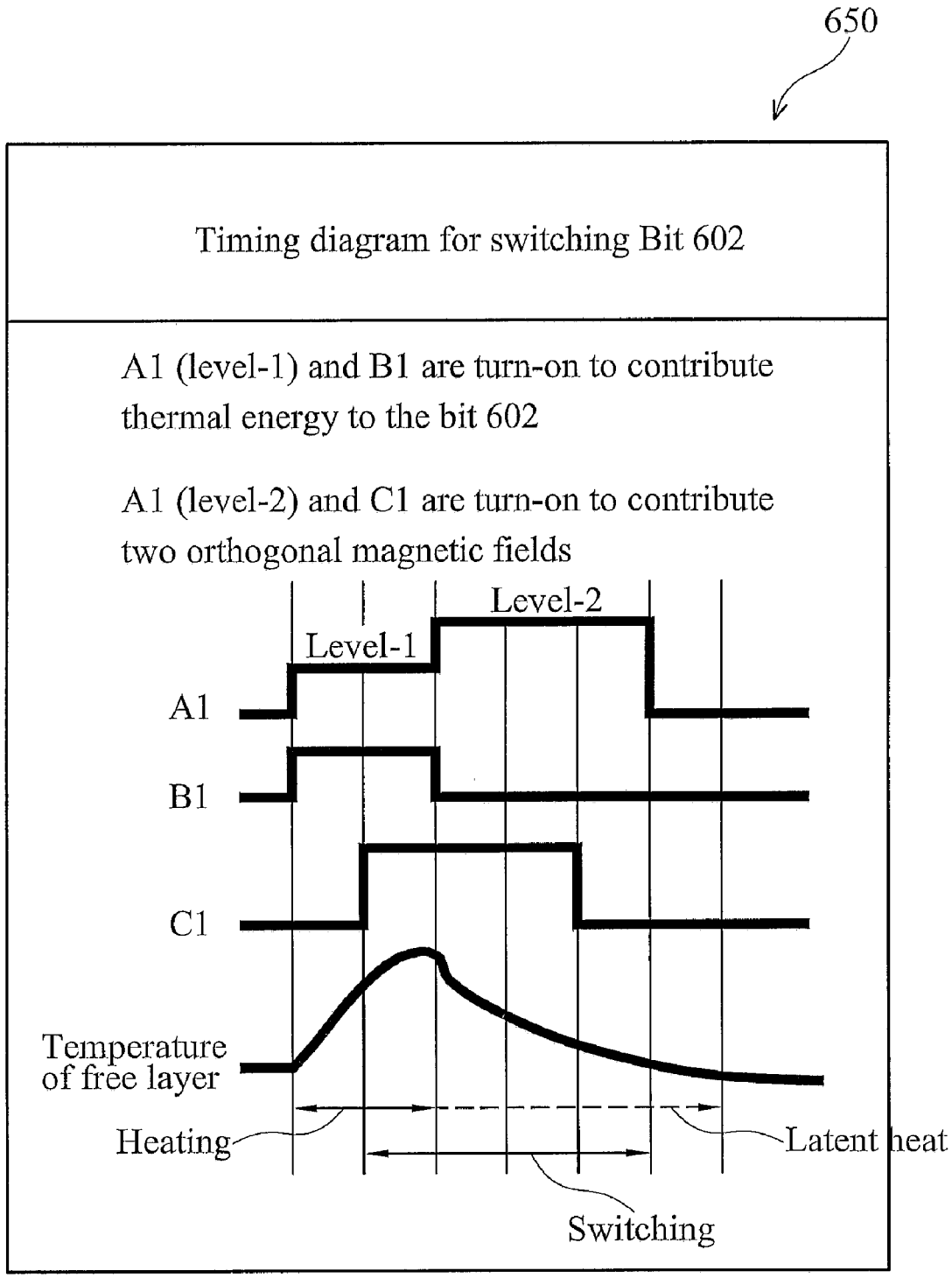
FIG. 6B illustrates a timing diagram showing the details of operating using the disclosed technique for the embodiment of FIG. 6A.

A timing diagram and an indication curve for temperature of the free layer are illustrated in FIG. 6B. In the timing diagram, A1's Level 1 and the B1 pulse may or may not be synchronized, but they are at least partly overlapped. Similarly, A1's Level 2 and the C1 pulse may or may not synchronize, but they are at least partly overlapped as the latent heat (controlled by A1's Level 1 and B1 pulses) is still effectively keeping the Hc lower than without heating. Thus, this embodiment of the disclosed 3-parameter switching technique is comprised of A1's Level 1 to decrease Hc (with B1 activating switch 610), and then the combination of the magnetic field generated by A1's Level 2 (with switch 610 not conducting) and the magnetic field generated along line C1.

Figure 7:
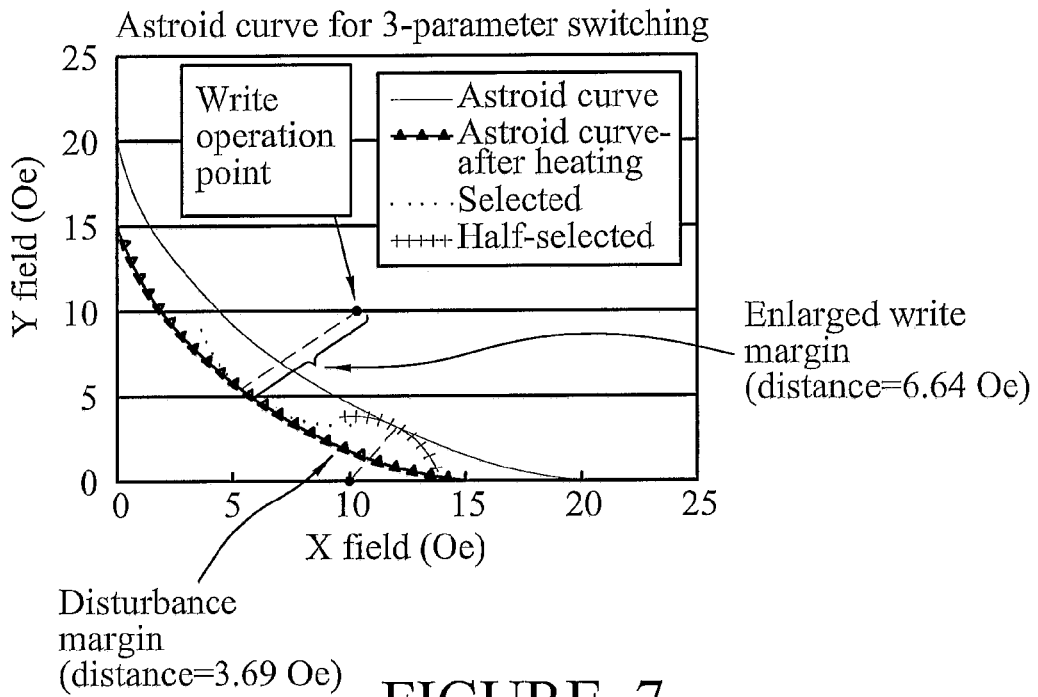
FIGS. 7 and 8 illustrate astroid curves depicting relationships between the disturbance margin and write margin of MRAM arrays constructed according to the principles disclosed herein.
Figure 8:
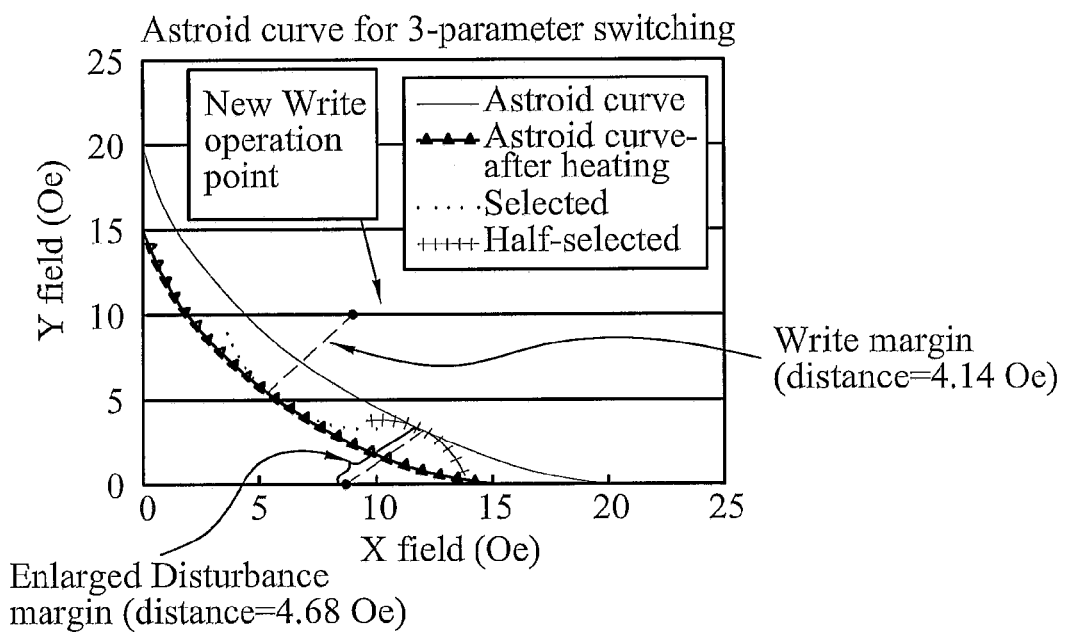

FIGS. 7 & 8 illustrate distinct astroid curves depicting relationships between the disturbance margin and write margin of MRAM arrays constructed according to the principles disclosed herein. As discussed above, employing the disclosed 3-parameter switching technique results in less disturbance by allowing the use of less switching currents across the array. As a result, the benefits may be accurately described from two points of view. First, it can be said that the overall disturbance for the arrays is decreased by enlarging the write margin with respect to the original disturbance margin, which is shown in the astroid curve in FIG. 7. In such embodiments, by enlarging the write margin, the selected MRAM bits can be written with lesser signals, while the chance for inadvertently writing unselected bits is decreased. In the curve of FIG. 7, the write margin is improved by 60%, from 4.14 Oe to 6.64 Oe. Conversely, it may be said that the overall disturbance is decreased by enlarging the disturbance margin in view of the original write margin, as shown in the astroid curve in FIG. 8. In these embodiments, while the write margin may remain the same, the enlarging of the disturbance margin helps to decrease inadvertent writing of unselected bits. In the curve in FIG. 8, the disturbance margin is improved by 28%, from 3.69 Oe to 4.68 Oe. Accordingly, no matter which view is taken, the overall disturbance of MRAM arrays constructed in conventional layouts is improved by employing the principles of 3-parameter switching disclosed herein.

While various embodiments of the disclosed technique have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of writing data to an array of magnetic memory cells using at least three parameters, wherein each of the memory cells comprise a stack of a free ferromagnetic layer, a pinned ferromagnetic layer, and an insulating tunneling barrier located therebetween, the method comprising:
   providing a non-magnetic effect to select ones of the memory cells sufficient to decrease a coercivity of the select memory cells below a predetermined threshold;
   providing a first magnetic field proximate to the select ones of the memory cells;
   providing a second magnetic field proximate to the select ones of the memory cells during the providing of the first magnetic field; and
   altering the magnetic moment of the select memory cells by exceeding a threshold magnetic field of the select memory cells with a combination of the decreased coercivity, the first magnetic field, and the second magnetic field.

2. A method according to claim 1, wherein providing the non-magnetic effect comprises providing a heat effect in the select memory cells to increase a temperature of the select memory cells to decrease the coercivity of the select memory cells below the predetermined threshold.

3. A method according to claim 1, wherein the first magnetic field is provided orthogonally to the second magnetic field.

4. A method according to claim 1, wherein providing the first and second magnetic fields further comprises providing the first and second magnetic fields proximate to the select ones of the memory cells during the providing of the non-magnetic effect.

5. A method according to claim 1, wherein providing the first magnetic field further comprises providing the first magnetic field proximate to the select memory cells by providing current to, but not through, the select ones of the memory cells, and during the providing of the second magnetic field.

6. A method according to claim 5, wherein the current provided to, but not through, the select memory cells to provide the first magnetic field is provided via a same conductor as that used to provide the non-magnetic effect through the select memory cells.

7. A method according to claim 5, wherein the providing the second magnetic field comprises providing a second current to the select ones of the memory cells.

8. A method according to claim 7, wherein the second current is greater than the first current.

9. A method according to claim 5, wherein the first magnetic field is provided orthogonally to the second magnetic field.

10. A method according to claim 5, further comprising activating switching devices coupled to corresponding ones of the select memory cells to provide the first current through the select memory cells, and deactivating the switching devices to provide the first magnetic field to, but not through, the select memory cells.

11. A method of writing data to an array of magnetic memory cells using at least three parameters, wherein each of the memory cells comprises a stack of a free ferromagnetic layer, a pinned ferromagnetic layer, and an insulating tunneling barrier located therebetween, the method comprising:
- providing a current through select ones of the memory cells to increase a temperature of the select memory cells sufficient to decrease their coercivity below a predetermined threshold;
- providing a first magnetic field proximate to the select ones of the memory cells;
- providing a second magnetic field proximate to the select ones of the memory cells during the providing of the first magnetic field; and
- altering the magnetic moment of the select memory cells by exceeding a threshold magnetic field of the select memory cells with a combination of the decreased coercivity, the first magnetic field, and the second magnetic field.

12. A method according to claim 11, wherein the first magnetic field is provided orthogonally to the second magnetic field.

13. A method according to claim 11, wherein providing the first magnetic field further comprises providing the first magnetic field proximate to the select memory cells by ceasing providing the current through the select memory cells, but providing the current to the select memory cells during the providing of the second magnetic field.

14. A method according to claim 13, wherein the current provided to the select memory cells is greater than the current provided through the select memory cells.

15. A method according to claim 11, wherein providing the first and second magnetic fields further comprises providing the first and second magnetic fields proximate to the select ones of the memory cells during the providing of the current through the select ones of the memory cells.

16. A method according to claim 11, wherein providing the first magnetic field further comprises providing the first magnetic field proximate to the select memory cells by providing current to, but not through, the select ones of the memory cells, and during the providing of the second magnetic field.

17. A method according to claim 16, wherein the providing the second magnetic field comprises providing a second current to the select ones of the memory cells.

18. A method according to claim 17, wherein the second current is greater than the first current.

19. A method according to claim 16, further comprising activating switching devices coupled to corresponding ones of the select memory cells to provide the first current through the select memory cells, and deactivating the switching devices to provide the first magnetic field to, but not through, the select memory cells.

20. A method of writing data to an array of magnetic memory cells using at least three parameters, wherein each of the memory cells comprises a stack of a free ferromagnetic layer, a pinned ferromagnetic layer, and an insulating tunneling barrier located therebetween, the method comprising:
- providing a first current through select ones of the memory cells to increase a temperature of the select memory cells sufficient to decrease their coercivity below a predetermined threshold;
- providing a second current to, but not through, the select ones of the memory cells to provide a first magnetic field to the select memory cells;
- providing a third current to the select ones of the memory cells to provide a second magnetic field to the select memory cells that is orthogonal to the first magnetic field and during the providing of the first magnetic field; and
- altering the magnetic moment of the select memory cells by exceeding a threshold magnetic field of the select memory cells with a combination of the decreased coercivity, the first magnetic field, and the second magnetic field.

* * * * *